United States Patent [19]
Sanielevici et al.

[11] Patent Number: 6,018,553
[45] Date of Patent: Jan. 25, 2000

[54] MULTI-LEVEL MIXER ARCHITECTURE FOR DIRECT CONVERSION OF FSK SIGNALS

[75] Inventors: Sergio A. Sanielevici, Los Altos; Stephen F. Lloyd, Palo Alto; Kenneth R. Cioffi, Milpitas, all of Calif.

[73] Assignee: Wireless Access, Santa Clara, Calif.

[21] Appl. No.: 08/715,442

[22] Filed: Sep. 18, 1996

[51] Int. Cl.[7] .............................. H03D 3/00; H04L 27/14
[52] U.S. Cl. .......................................... 375/334; 375/335
[58] Field of Search .................................. 375/334, 335; 329/302, 306; 455/302

[56] References Cited

U.S. PATENT DOCUMENTS

| | | | |
|---|---|---|---|
| 4,583,048 | 4/1986 | Gumacos et al. | 329/122 |
| 4,682,117 | 7/1987 | Gibson | 329/50 |
| 4,776,039 | 10/1988 | Akaiwa | 455/205 |
| 4,910,467 | 3/1990 | Leitch | 329/306 |
| 5,014,352 | 5/1991 | Chung | 455/314 |
| 5,179,578 | 1/1993 | Ishizu | 375/86 |
| 5,208,829 | 5/1993 | Soleimani et al. | 375/1 |
| 5,400,365 | 3/1995 | Tulai | 375/88 |
| 5,418,489 | 5/1995 | Traylor | 329/327 |
| 5,550,869 | 8/1996 | Gurantz et al. | 375/340 |
| 5,612,971 | 3/1997 | Dormer | 375/202 |

*Primary Examiner*—Stephen Chin
*Assistant Examiner*—Mohammad Ghayour
*Attorney, Agent, or Firm*—Blakely, Sokoloff, Taylor & Zafman LLP

[57] ABSTRACT

A multi-level quadrature (I/Q) mixer for use in a communication system such as a paging device, where the mixer includes first and second I/Q downconversions followed by demodulation. The first I/Q downconversion converts an I/Q signal pair to a first IF, and the second I/Q downconversion converts an I/Q signal pair to a second IF. The first IF may or may not be the center frequency depending on the number of subchannels in the single channel being downconverted.

20 Claims, 8 Drawing Sheets

MULTI-LEVEL MIXER ARCHITECTURE FOR DIRECT CONVERSION OF FSK SIGNALS

FIELD OF THE INVENTION

The present invention relates to the field of signal processing; more particularly, the present invention relates to multi-level mixers and their use in extracting signals in systems such as communications systems.

BACKGROUND OF THE INVENTION

A communication system transfers information between a source and a destination. Generally, a communication system includes a transmitter and a receiver which transmit and receive information signals over some media, respectively. This media may be cable wiring or atmosphere. When communications occur over atmosphere, or air waves, they are commonly referred to as "wireless" communications. Examples of wireless communications systems include digital cellular, packet data paging and digital cordless telephones, wireless modems, wireless local and wide area networks, digital satellite communications and personal communications networks.

A new communication system, termed "Multicarrier QFSK" (for Quadrature Frequency Shift Keying), is being developed for use in pagers and other portable equipment. In one QFSK system, four separate bands are arranged about a center frequency $f_c$. FIG. 1 illustrates an example receiving spectrum. Referring to FIG. 1, each of the four bands A–D carries separate signals in a bandwidth of about 8 KHz. The two bands adjacent to $f_c$ have a center frequency spaced 5 KHz from $f_c$, while the two outside bands have a center frequency spaced about 15 KHz from $f_c$. The frequency deviations for each channel are +/−800 Hz and +/−2400 Hz at a data rate of 3200 bps. One existing QFSK system that uses four separate bands is commonly referred to as REFLEX50.

To effectively use a QFSK system, the four subchannels must first be separated. One problem is how to separate the four subchannels with the low power consumption necessary for effective use in portable equipment such as pagers.

A conventional separation solution would be to use a I/O mixer that takes a signal and divides it into 20 KHz bands on either side of $f_c$ to provide two signals, the I and Q signals. A conventional system would apply digital signal processing (DSP) techniques to each of the I and Q signals to obtain the output signals. Particularly, because each signal (the I signal and the Q signal) contain two separate signals, these signals would require separating, and a DSP is a conventional way to separate such signals. This solution is acceptable for systems in which power consumption is relatively unimportant, such as desk top systems. However, for low power consumption in portable systems, DSP channel separation systems consume an unacceptable amount of power. Furthermore, dedicated hardware for such a DSP system can be prohibitively expensive. Another separation system that would provide low power consumption and low cost would be useful.

Moreover, many QFSK systems utilize a single carrier FSK modulation, such as the REFLEX25 system. It would be desirable to provide a solution capable of use in systems using a single channel or multiple sub-channels.

SUMMARY OF THE INVENTION

A receiver for use in a communications system is described. In one embodiment, the receiver comprises first and second I/Q downconversions. The first I/Q downconversion generates a first set of I and Q channels at a first IF, while the second I/Q downconversion generates a second set of I and Q channels at a second IF in response to the I channel of the first set of I and Q channels and generates a third set of I and Q channels at a second IF in response to the Q channel of the first set of I and Q channels.

In one embodiment, multi-level mixer circuit is disclosed for demodulating multiple channels simultaneously to provide high speed communication. The multi-level mixer circuit receives I and Q signals, such as are generated by a standard mixer, and performs two separate and parallel levels of mixing and demodulation.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

Figure 1:
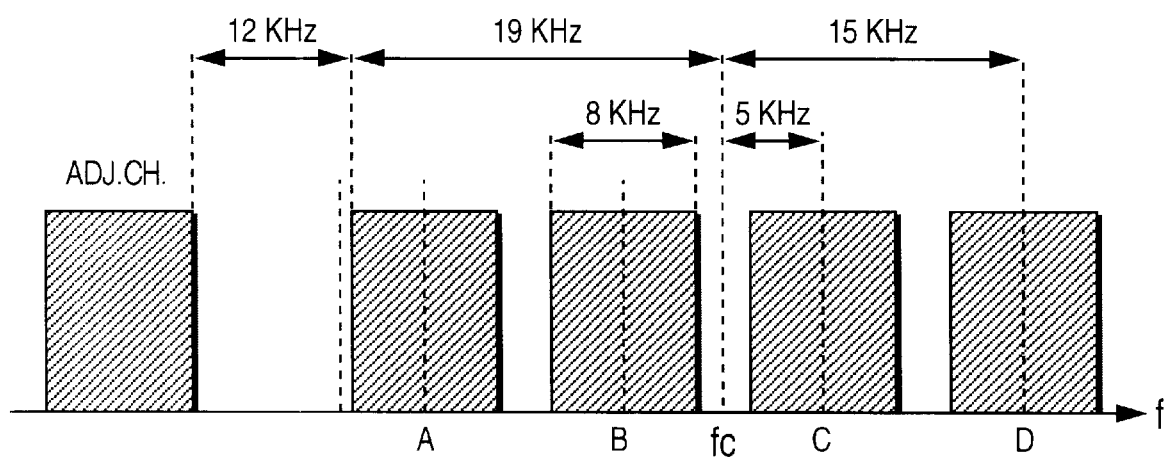
FIG. 1 illustrates a QFSK system including the four carrier channels.

A mixer for use in generating signals is described. In the following description, numerous details are set forth, such as frequencies, protocols, etc. It will be apparent, however, to one skilled in the art, that the present invention may be practiced without these specific details. In other instances, well-known structures and devices are shown in block diagram form, rather than in detail, in order to avoid obscuring the present invention.

Overview of the Present Invention

The present invention provides a double I/Q downconversion architectural scheme for use in a communications device (e.g., a receiver) in FSK systems. The FSK system may be a single channel without subchannels (e.g., REFLEX25) or with multiple subchannels (e.g., four sub-channels as in REFLEX50).

The double I/Q downconversion of the present invention is performed using two sets of I/Q downconversion mixers (i.e., two downconversion stages). In one embodiment, the first set of I/Q downconversion mixers generates a quadrature signal using a local oscillator signal to downconvert the input signal to a zero IF, such as in the case of a single channel with four subchannels. In an alternate embodiment, the first set of I/Q downconversion mixers generates a quadrature signal using a local oscillator signal, which may be at a non-zero IF, such as in the case of a single channel without subchannels.

The second set of I/Q downconversion mixers further downconvert the I/Q signals to a second IF frequency. After the second set of I/Q downconversion mixers, an image rejection stage combines two sets of I/Q outputs to cancel an image due to the downconversion performed by the first I/Q downconversion mixer.

The present invention also includes an apparatus for demodulating a QFSK signal that includes a multi-level mixer for separating multiple signals of two different frequencies (e.g., 5 KHz and 15 KHz) into multiple subchannels simultaneously using parallel levels of mixing and demodulation. In one embodiment, a paging (or other communications) device is capable of being set, permanently or otherwise, to demodulate a single channel or to demodulate a signal channel with multiple subchannels.

In one embodiment of the multi-level mixer, a special mixing waveform and a special mixer are used. The mixing waveform does not include any harmonic frequencies which may be used elsewhere in the mixer for the downconversion of other signals. The mixer includes a pair of input lines and a pair of output lines coupled by switches operable in response to the current state of the mixing waveform.

The Receiver of the Present Invention

One embodiment of the present invention operates with the REFLEX50 four subchannel protocol where each of the four subchannels uses 4-level frequency shift keying (FSK). In such a case, the present invention supplies the I signal and the Q signal to a mixer such as illustrated in FIG. 2.

The mixer of FIG. 2 receives the QFSK signal containing four subchannels, downconverts the composite channels into an I signal and a Q signal, and subsequently separates the subchannel signals, providing four output I/Q pairs. The I/Q signals may be generated by mixing a QFSK signal with signals from a local oscillator (local oscillator carrier frequency $\omega_c$ at 0° to provide an I signal and $\omega_c$ at 90° to provide the Q signal). In other words, the I and Q signals are outputs from a standard mixer stage, which performs the first of the two downconversions of the present invention. This downconversion is to a 0 IF. In one embodiment, this first downconversion or mixer stage may be included in the front circuitry of the communications device.

Figure 2:
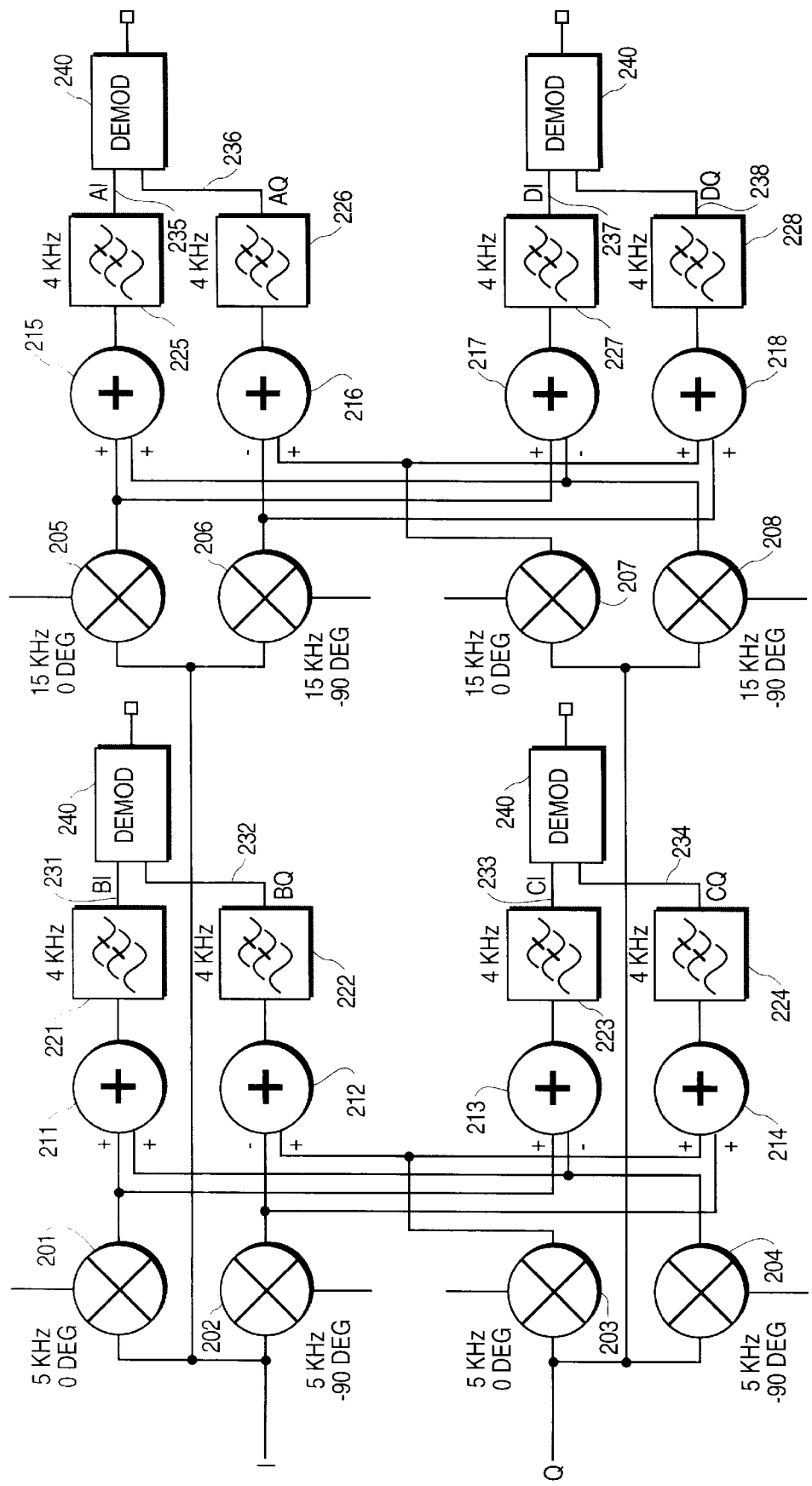
FIG. 2 is a diagram of the multi-level mixer system for separating signals according to the present invention.

FIG. 2 will be described with reference to local oscillator frequencies of 5 and 15 KHz corresponding to subchannels in a REFLEX50 system. However, it would be apparent that the following embodiment may be implemented with any two frequencies for four subchannels, any three frequencies for six subchannels, etc.

Referring to FIG. 2, the multi-level mixer is coupled to receive I and Q signals. Each of the I and Q signals include four channels (+/−5 KHz, +/−15 KHz) which are on top of each other, but are at different phases. Note that each of the I and Q signals may be differential signals.

The I signal is applied to a mixer 201 that mixes the I signal with signal generated by a local oscillator at 5 KHz and a 0° phase shift and to a mixer 202 that mixes the I signal with signal generated by a local oscillator at 5 KHz and a −90° phase shift. The Q signal is applied to a mixer 203 that mixes the Q signal with signal generated by a local oscillator 5 KHz and a 0° phase shift and a mixer 204 that mixes the I signal with signal generated by a local oscillator at 5 KHz and a −90° phase shift.

The multi-level mixer also applies the I signal to a mixer 205 that mixes the I signal with signal generated by a local oscillator at 15 KHz and a 0° phase shift and to a mixer 206 that mixes the I signal with signal generated by a local oscillator at 15 KHz and a −90° phase shift. The Q signal is applied to a mixer 207 that mixes the Q signal with signal generated by a local oscillator 15 KHz and a 0° phase shift and a mixer 208 that mixes the I signal with signal generated by a local oscillator at 15 KHz and a −90° phase shift.

Together mixers 201–208 comprise a first level of mixers that result in four separate I/O pairs and 8 separate downconversions.

The mixed outputs from the first level are respectively summed as shown in FIG. 2 using a pair of adders (one of which operates as a subtractor). The adders subtract out the other channels that were due to the downconversion. The results of the additions are filtered with a 4 KHz filter to output I and Q signals for each channel in a form that can be demodulated.

That is, the output of the mixer 201 and the mixer 204 are summed by adder 211 and filtered at 4 KHz with a low pass filter 221 to provide a BI output 231. The output of the mixer 202 is then subtracted from the output of the mixer 203 by adder 212 to provide an output which is then filtered at 4 KHz using low pass filter 222 to provide a BQ output 232.

The output of the mixer 204 is subtracted from the output of the mixer 201 using adder 213 and then filtered at 4 KHz with a low pass filter 223 to provide the CI output 233. The output of the mixer 202 is summed with the output of the mixer 203 using adder 214 and filtered at 4 KHz with a low pass filter 224 to provide a CQ output 234.

The output of the mixer 205 is summed with the output of the mixer 208 using adder 215 and filtered at 4 KHz with a low pass filter 225 to provide an AI output 235. The output of the mixer 206 is subtracted from the output of the mixer 207 using adder 216 which is then filtered at 4 KHz with a low pass filter 226 to provide an AQ output 236.

The output of the mixer 208 is subtracted from the output of the mixer 205 which is then filtered at 4 KHz with a low pass filter 227 to provide a DI output 237. Finally, the output of the mixer 206 is added to the output of the mixer 207 which is then filtered at 4 KHz with a low pass filter 228 to provide a DQ output 238.

The respective outputs AI, AQ, BI, BQ, CI, CQ, DI, and DQ are then demodulated in pairs using an appropriate, conventional demodulation system 240.

Thus, the present invention provides a multi-level mixer that separates multiple channels simultaneously in parallel.

Note that the portion of the multi-level mixer beyond the first level of mixers (201–208) is the same for each of the subchannels. In one embodiment, the mixer of the present invention only includes one such portion, and not four. In such a case, this one portion supports all four subchannels. A switch interfaces the first level of mixers 201–208 to this portion to control which of the signals output from the mixers 201–208 are to be used based on which subchannel has been selected. Such switching logic is well-known to those skilled in the art.

The use of the switching logic is also advantageous in that it allows the same manufactured device to support operation of a paging device that is based on a single channel/no subchannel system (e.g., REFLEX25) or a single channel/multiple subchannel system (e.g., REFLEX50). For instance, an integrated circuit containing the mixing architecture may be designed such that a setting on the device (e.g., wire bond, one or more pins, programmable bit position(s)) may be set with one or more conditions to select a configuration of the mixing architecture for single channel, no subchannel, or multiple (e.g., four) subchannel embodiments. Similar settings or other types of programming may also set the device to be responsive to particular subchannels. By being able to "program" the device, manufacturing costs may be reduced since only one board design is needed and thereafter configured for the system in which it will be used.

Mixing Waveform and Mixer of the Present Invention

The present invention uses a novel shaped mixing waveform and a novel mixing circuit to eliminate a harmonic component that would downconvert an adjacent subchannel as well as the wanted channel. In one embodiment, the mixing waveform eliminates the third harmonic component of the 5 KHz local oscillator that would downconvert the immediately adjacent subchannel at 15 KHz on top of the wanted channel at 5 KHz such as in a REFLEX50 system. However, a waveform may be used for mixing that does not include harmonics of any other downconverted frequency.

Figure 3:
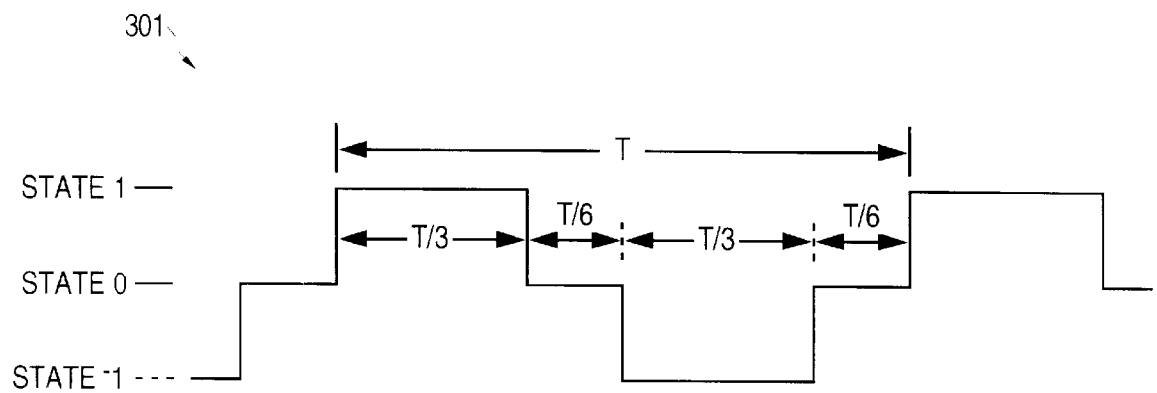
FIG. 3 is a diagram of a mixing waveform for eliminating third order harmonics in the waveform produced using this waveform.

FIG. 3 illustrates one embodiment of a shaped mixing waveform output from the 5 KHz local oscillator in order to avoid the 15 KHz harmonic that would otherwise combine with the 15 KHz signal and corrupt the signal at the 5 KHz demodulation in a multi-subchannel system. Referring to FIG. 3, the mixing waveform 301 has a time period T, during which the mixing waveform may be in one of three different states during four subperiods. During the first one-third of the time period T, the mixing waveform is in State 1. Then the mixing waveform 301 transitions to State 0 for one-sixth of the time period T, followed by the mixing waveform 301 being in State −1 for one-third of the time period T. Lastly, the mixing waveform 301 returns to State 0 for the final one-sixth of the time period T.

The generation of the mixing waveform of the present invention would be well-known to those skilled in the art. It should be noted that similar waveforms may be generated to eliminate other harmonics (e.g., 5th, 7th, 9th harmonics) which may interfere with subchannels.

Figure 4:
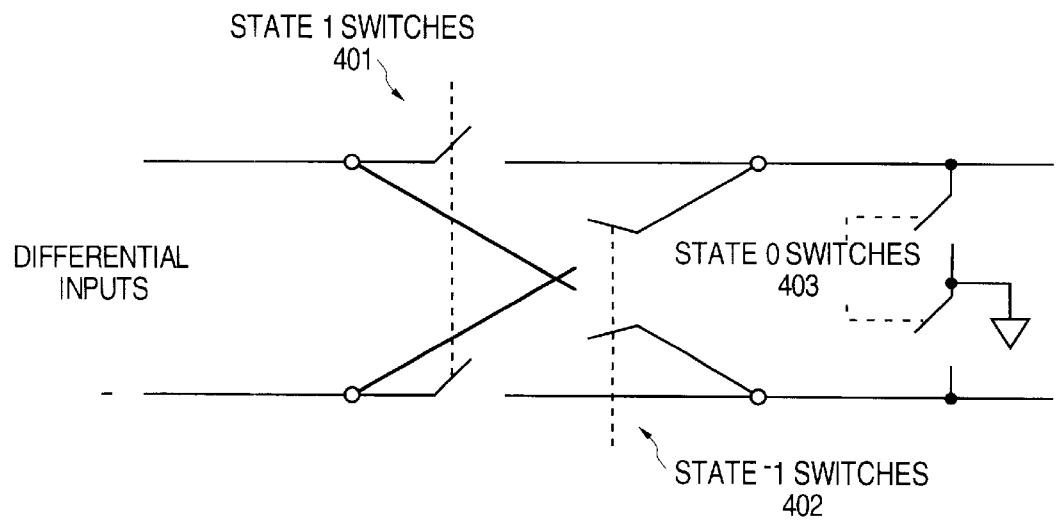
FIG. 4 is a diagram of a mixer circuit that utilizes the mixing waveform of FIG. 3.

In one embodiment, the mixers are digital mixers that receive the mixing waveform of the present invention and reduce or eliminate harmonics that would otherwise distort an adjacent subchannel (e.g., the 15 KHz waveform in a multi-subchannel system). FIG. 4 illustrates one embodiment of a mixer used in the present invention.

Referring to FIG. 4, the mixer of the present invention comprises first and second input lines for a differential input signal, first and second output lines, and three sets of switches. Each set of switches is operable when the mixing waveform of the present invention is in one of its three states. State 1 switches 401 couple the first and second input lines directly to the first and second output lines, respectively, when the mixing waveform is in State 1, such that the mixer outputs the input signal unchanged. State −1 switches 402 couple the first and second lines directly to the second and first output lines, respectively, when the mixing waveform is in State −1, such that the mixer reverses the phase of the input signal with a 180° phase shift. State 0 switches 403 couple the first and second output lines, via short-circuit, to ground when the mixing waveform is in State 0, such that the mixer does not output the input signal.

Of course, during each subsequent time periods the mixing waveform is repeated and the mixer in FIG. 4 is controlled accordingly.

Mathematics for Subchannel Separation and Image Rejection

The image rejection action of the double I/Q downconversion scheme can be described mathematically as given here. In order to simplify the analysis, only two of the four subchannels with frequencies of $\omega_c-\omega_1$ and $\omega_c+\omega_1$ will be considered where $\omega_c$ is the carrier frequency and $\omega_1$ is the subchannel offset frequency. These two frequencies are images of each other when the first downconversion is direct. The subchannel input waveform to the first I/Q mixer then has a mathematical description as follows:

$$Fi=\cos[(\omega_c-\omega_1)t+\Phi_B(t)]+\cos[(\omega_c+\omega_1)t+\Phi_c(t)]$$

where $\Phi_B(t)$ and $\Phi_c(t)$ are the FSK deviation phase shifts. The first I/Q 20 downconversion results in the following equation assuming that the I and Q LO signals are given by $2\cos(\Phi_c)t$ and $2\sin(\Phi_c)t$:

$$I=\cos[-\omega_1't+\Phi_B(t)]+\cos[\Phi_1't+\Phi_c(t)]$$

$$Q=-\sin[-\omega_1t+\Phi_B(t)]-\sin[\Phi_1t+\Phi_c(t)]$$

In these equations, the component at the 2nd harmonic of the carrier frequency has assumed to have been removed by filtering. The second I/Q downconversion results in the following equations assuming that the I and Q LO signals are given by $2\cos(\Phi_1)t$ and $2.\sin(\Phi_1)t$:

$$I_1=\cos[\omega_B(t)]+\cos[\omega_c(t)]$$

$$I_Q=\sin[\omega_B(t)]+\sin[\omega_c(t)]$$

$$Q_1=-\sin[\omega_B(t)]+\sin[\omega_c(t)]$$

$$Q_Q=\cos[\omega_B(t)]-\cos[\omega_c(t)]$$

In these equations, the second harmonic of the subchannel carrier frequency has been assumed to have been removed by filtering. New I and Q pairs for each of the individual subchannels can be formed by the following additions:

$$I_B=I_I+Q_Q=2\cos[\omega_B(t)]$$

$$Q_B=I_Q+Q_I=2\sin[\omega_B(t)]$$

$$I_C=I_I-Q_Q=2\cos[\omega_c(t)]$$

$$Q_C=I_Q+Q_I=2\sin[\omega_c(t)]$$

These equations are implemented with the adders shown in FIG. 2.

Single Channel without Subchannels

In one embodiment, the receiver of the present invention operates using a double downconversion architecture to perform an analog downconversion that downconverts the I/Q signals to a frequency offset from the center frequency, such that the downconversion is to an IF other than zero. The use of the architecture in this form is referred to herein as offset double direct downconversion. The architecture combines the cost and integration advantages of a direct downconversion scheme while eliminating I/Q phase mismatch, local oscillator (LO) leakage and DC offset problems which commonly plague traditional direct conversion architectures.

This offset double direct downconversion of the present invention is described for use with REFLEX25 single channel 4-level FSK system. It should be noted that the present invention is applicable to other types of systems with one or more channels.

Figure 5:
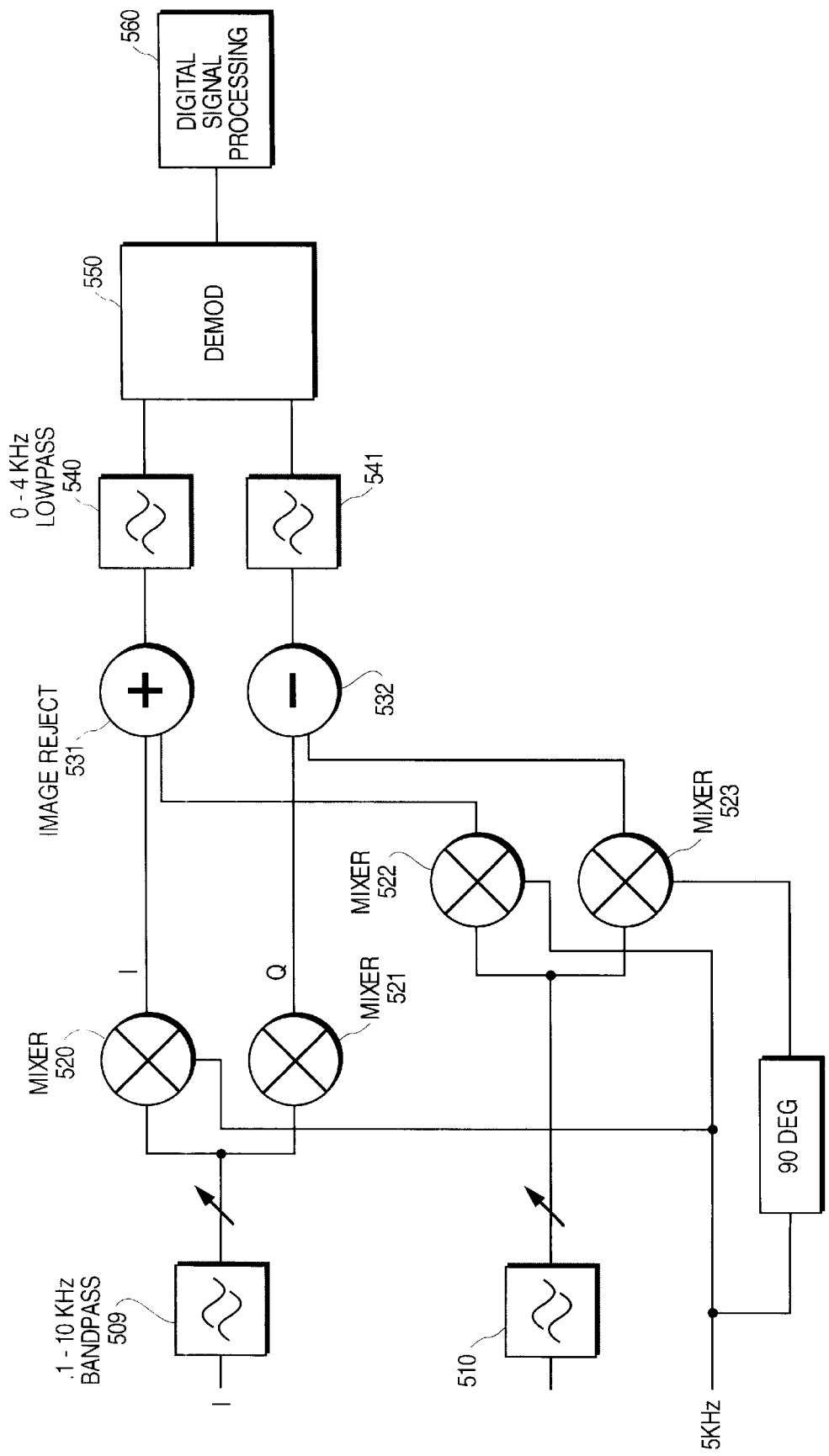
FIG. 5 is a block diagram of an alternate embodiment of the receiver for use in performing an analog downconversion scheme of the present invention.

FIG. 5 illustrates one embodiment of a portion of a receiver that performs a portion of the offset double direct downconversion of the present invention. In one embodiment, this portion of the receiver comprises analog demodulation circuitry of a communication device (e.g., a pager). Although the present invention is described in conjunction with a specific paging communication system, it is also applicable to signals of other types of communications systems.

Referring to FIG. 5, I and Q signals from a front end circuitry in a communications device are received by the mixer of the present invention. Although FIG. 5 shows the I and Q signals as being single signals, each signal may be a pair of differential signals, which are equal and opposite (e.g., 180° out of phase).

The I and Q signals are fed to bandpass filters 509 and 510 respectively, which filter the DC offset and provide adjacent channel filtering. This filtering may be necessary because the signal strength at this point can be very small and small DC offsets can swamp out the input signal or affect automatic gain control (AGC) gain. In one embodiment, the bandpass filters comprise a 0.1–10 KHz bandpass filters. Where the double direct downconversion scheme is used for 4 subchannels (described above), the bandpass filters 509 and 510 comprise 20 KHz bandpass filters.

The output of the bandpass filter 509 is coupled to inputs of mixers 520 and 521, while the output of the bandpass filter 510 is coupled to inputs of mixers 522 and 523. Note that some adjustable gain amplifiers may be included after the bandpass filters 509 and 510.

Mixers 520–523 perform a second IF downconversion. In one embodiment, the second downconversion is to 0 KHz IF. In such a case, the input signals to the mixers 520 and 522 are mixed with a local oscillator of 5 KHz with no phase-shifting (i.e., a 0 degree phase-shifted signal), while the input signals to mixers 521 and 523 are mixed with a local oscillator of 5 KHz that is phase-shifted 90 degrees. Note that the DC offset at this point is small in comparison to the input signal due to the system gain up to this point and therefore does not affect the system performance.

In this embodiment, the mixing waveform is a square wave. The 5 use of a square wave is sufficient in a single channel system since there are no unwanted subchannels which may mix on top of the wanted channel.

The outputs of mixers 520 and 521 comprise one pair of I and Q signals respectively, and the outputs of mixers 522 and 523 comprise another pair of I and Q signals respectively. The two pairs of I and Q signals are input into an image rejection stage. The image rejection stage rejects the image frequency from the first I/O downconversion to 5 KHz IF, which was folded on top of the intended signal during the conversion, to improve the overall adjacent channel rejection and receiver sensitivity. Since this frequency falls in between channels, it contains only residual adjacent channel signal energy.

In one embodiment, the image rejection stage comprises an adder 531 and a subtractor 532. The adder 531 adds the I signal output of mixer 520 to the Q signal output of mixer 523. The subtractor 532 subtracts the Q signal output of mixer 521 from the I signal output of mixer 522. Thus, the outputs from the 2nd I/Q downconversion mixers 520–523 are combined by adder 531 and subtractor 532 in such a manner as to cancel the image as demonstrated above. Note that subtractor 532 may be implemented as an adder that adds the negative differential signal of the Q signal output of mixer 521.

The signal outputs of adder 531 and subtractor 532 are then low pass filtered by low pass filters 540 and 541 respectively. In one embodiment, the low pass filters 540 and 541 comprise 0–4 KHz lowpass filters.

The signals output from the low pass filters 540 and 541 are demodulated by demodulator 550. Demodulator 550 may comprise a frequency shift keying demodulator, or other well-known demodulator scheme.

In one embodiment, demodulator 550 converts the filtered I and Q signals from adder 531 and subtractor 532 into four new I/Q pairs separated by approximately 22.5 degrees. These four new I/Q pairs have the effect of multiplying the number of zero crossings by a factor of 4. These signals are then limited and sent to a phase detector which extracts the zero crossings. A digital demodulator then compares the I and Q outputs and determines whether the original frequency deviation is positive or negative for each I/Q pair. The output from this block is then 4 lines indicating positive deviation zero crossings and 4 lines representing negative deviation zero crossings.

The output from the demodulator 550 is then input to the digital signal processing block 560 which counts the zero crossings, extracts the symbol edge timing, and converts to the correct 2-bit output. For more information on one embodiment of DSP block 560, see U.S. patent application Ser. No. 08/715,441 filed on Sep. 18, 1996, entitled "Direct Demodulation Method and Apparatus", concurrently filed on Sep. 18, 1996, and assigned to the corporate assignee of the present invention.

Paging Device Overview

One embodiment of the system of the present invention is designed to demodulate 4 level FSK input signal in the REFLEX family of protocols for 2-way paging.

Figure 6:
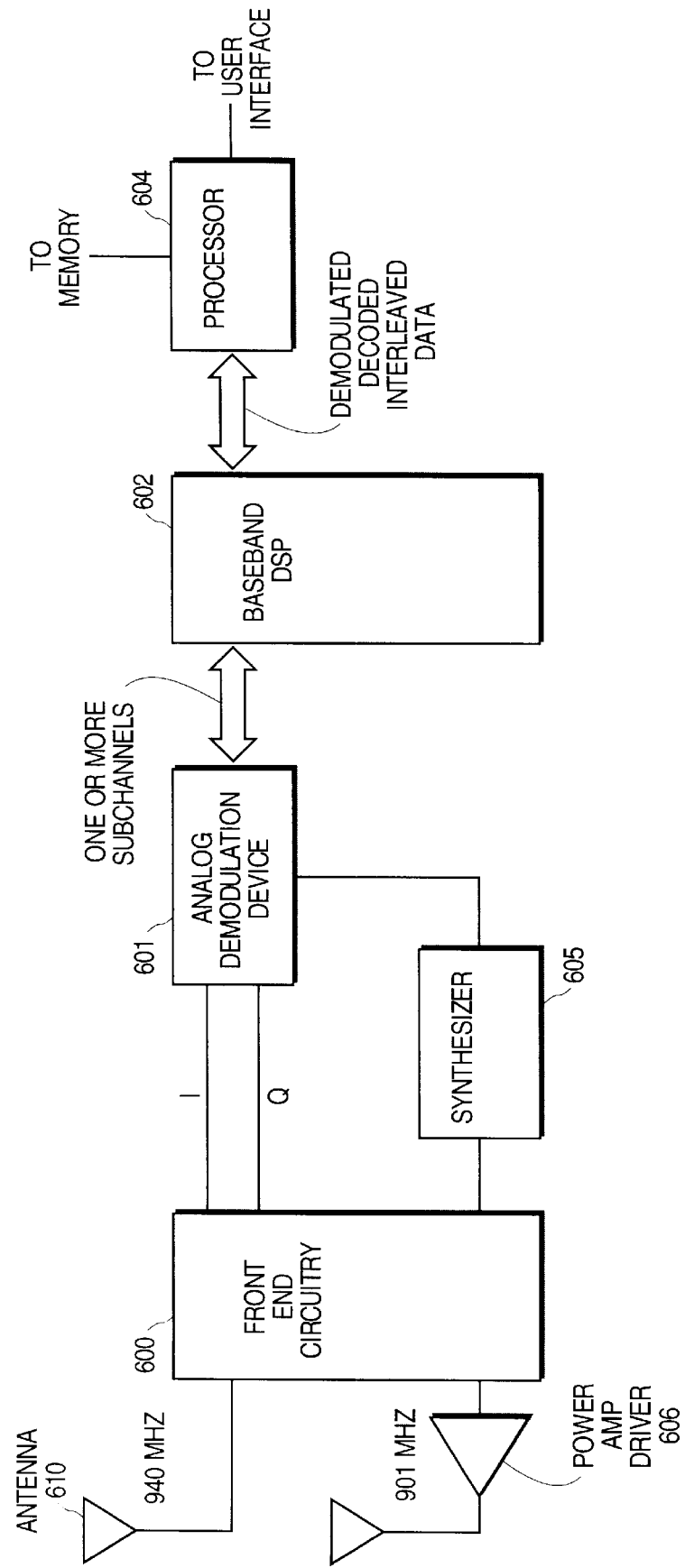
FIG. 6 is a block diagram of one embodiment of the internal system of a communications device.

FIG. 6 is a block diagram of one embodiment of a transceiver of the present invention. The transceiver of the present invention contains a receiver front end 600 and a transmitter power amplifier driver as well as separate voltage controlled oscillators (VCOs) for the transmitter and receiver. Referring to FIG. 6, analog demodulation circuitry and filtering 601 provide adjacent channel rejection for a 4×4 FSK signal. A baseband digital signal processing (DSP) device 602 translates the output from the analog demodulation circuitry 601 into data and extracts timing and frame synchronization information. The baseband device 602 also performs automatic frequency correction, power management, deinterleaving, and BCH decoding.

In receive operation, the 940 MHz 4 level FSK modulation is received at the antenna 610 and passed to front end circuitry 600. The front end circuitry 600 includes a variable attenuator that reduces the signal power of high strength signals in order to prevent co-channel and interchannel intermodulation distortion and increase dynamic range. The attenuator is controlled by an analog driver derived from AGC in the analog demodulation circuitry 601. The front end circuitry 600 amplifies and downconverts the signal to a low IF frequency (0–5 KHz). All frequencies required for the downconversion are generated from a single reference frequency. This frequency is generated by an external synthesizer 605 from a single reference oscillator contained on the analog demodulation circuitry 601. The front end circuitry 600 generates a quadrature (I/Q) output.

In one embodiment, the analog demodulation circuitry 601 is a CMOS integrated circuit containing the signal demodulation function. It accepts the I/Q output of the front end circuitry 600 and performs channel select filtering and FSK deviation frequency extraction. The resulting 8 output 4-phase zero crossing indicator information is input to the baseband digital signal processing (DSP) device 602 via a single serial interface. In one embodiment, the baseband digital signal processing (DSP) device 602 is also a CMOS integrated circuit. For more information on one embodiment of DSP device 602, see U.S. patent application Ser. No. 08/715,441, entitled "Direct Demodulation Method and Apparatus", concurrently filed on Sep. 18, 1996, and assigned to the corporate assignee of the present invention.

The analog demodulation device 601 also contains the system oscillator clock 1.2N MHz wherein N equals 1, 2, 3,... (e.g., 4.8 MHz) which is the synthesizer reference clock and from which all system clocks including the real time clock, the clocks in the baseband digital signal processing (DSP) device 602, and the clock of the processor 604 are derived. The processor 604 may be a microcontroller, DSP, or any other processing device whose instructions are obtained through a software interface. In one embodiment, the synthesizer references of 6.25 KHz resolution and 5 KHz resolution share a common frequency of 25 KHz, the subchannel baseband conversion using both 5 KHz and 15 KHz quadrature signals requiring a clock of 60 KHz, and the symbol rate for receive (3200 Hz) and transmit (4800 Hz) have a common frequency of 9.6 KHz. Thus, using a frequency such as 4.8 MHz, all of these clock signals may be generated using dividers.

In receive operation, the baseband digital signal processing (DSP) device 602 may perform the digital post detection filtering, timing recovery, slicer threshold detection, automatic frequency control, decoding, de-interleaving, final bit determination or any combination of these functions. After de-interleaving, the baseband digital signal processing (DSP) device 602 performs BCH decoding and sends the data to the microcontroller 604 for further processing.

In transmit operation, the baseband digital signal processing (DSP) device 602 inputs Read-Solomon encoded 4 level data and outputs 2 bit digital data to the premodulation filter contained on the analog demodulation circuitry 601. The filtered data is output from the analog demodulation circuitry 601 to the VCO of the front end circuitry 600 and to the reference oscillator which converts the data to an FSK modulated signal at 901 MHz. That signal is input to the preamplifier located on the front end circuitry 600 which outputs the signal at the appropriate drive level for the power amp driver 606.

Figure 7A:
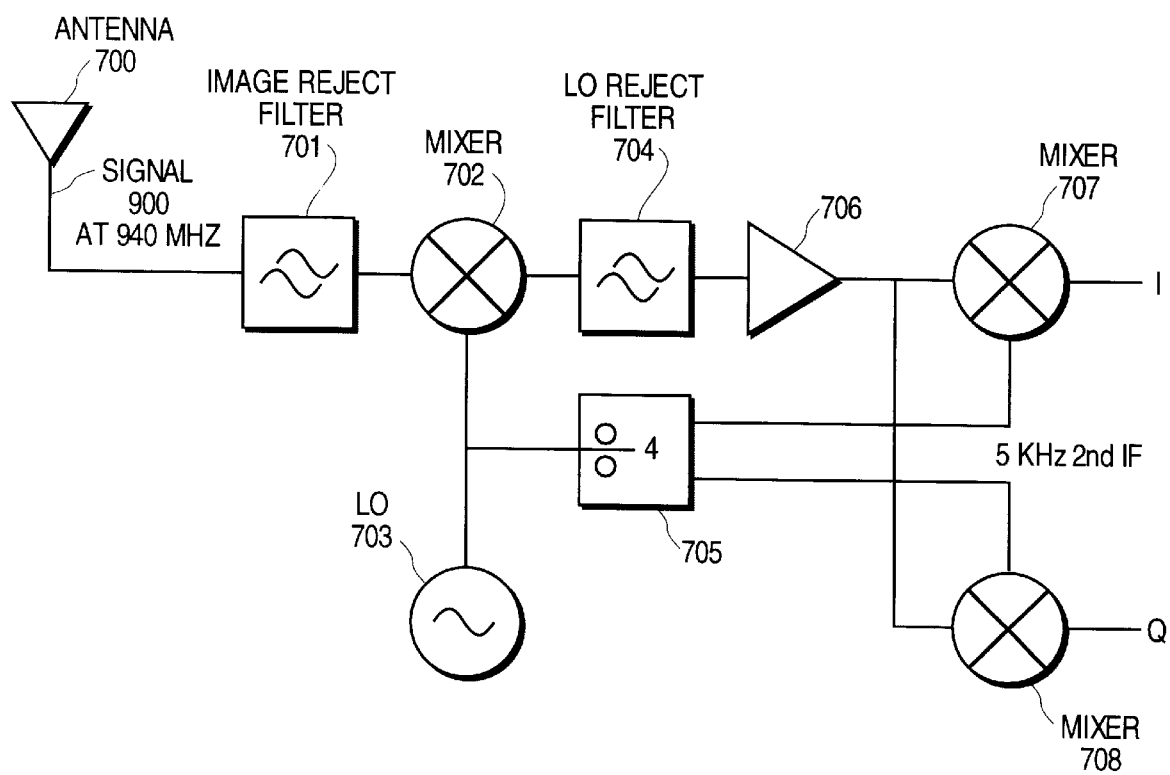
FIG. 7A is a block diagram of one embodiment of front end circuitry for use in a communications device.

FIG. 7A illustrates one embodiment of the receiver portion of the front end circuitry 600. Referring to FIG. 7A, a paging signal is received by an antenna 700 of a paging device. In one embodiment, the signal has an RF frequency of 940 MHz. The signal is received by an image reject filter 701 that filters an image from the received signal. The image is created due to the dual sideband conversion of the mixer of the present invention. The filtering by the image reject filter 201 reduces leakage to the antenna port and compensates for the local oscillators (described below) which are generated out of band with the input RF signal. This avoids leakage problems that may cause harmful interference to nearby receivers which are typical in direct downconversion. Image reject filters are well-known in the art.

After the image filtering, the signal is input to a mixer 702, which 20 downconverts the RF frequency of the received signal to a first IF frequency by using a second signal from a local oscillator (LO) 703. In one embodiment, where the LO signal that is input to the mixer 702 has a RF frequency of 752 MHz. Thus, the mixer 702 downconverts the signal to 188 MHz or approximately 1/5 of its input frequency.

The output of the mixer 702 is input to a LO reject filter 704 which filters the LO from the signal. The filtered signal output from the LO reject filter 704 is input to a buffer amplifier (amp) 706. The LO reject filter 704 rejects leakage signal from the LO 703 so that this signal does not overpower buffer amp 706 or any circuitry following the buffer amp 706.

The buffer amp 706 amplifies the signal to levels appropriate for input to mixer 207.

The signal from the LO 703 is also input to a divide-by-four 705, which divides the signal by four and outputs the divided signal to mixers 707 and 708 as a second local oscillator. In this manner, the present invention provides a second downconversion using a second LO which is 1/4 of the first LO. This is the first I/Q downconversion. In one embodiment, the first I/Q downconversion is to the center of the channel. In an alternative embodiment, the first I/Q downconversion is not to the center of the channel and is, instead, to an offset from the center of the channel.

In one embodiment, the first LO is often chosen to generate a small second IF frequency of 5 KHz instead of 0 KHz which is used in more conventional direct conversion approaches. The offset frequency is chosen such that the image frequency falls in an unused portion of the surrounding radio spectrum. Because of this, the image rejection has the principal function of providing noise cancellation. The offset frequency allows filtering of the DC offset caused by I/Q mixer mismatches.

Figure 7B:
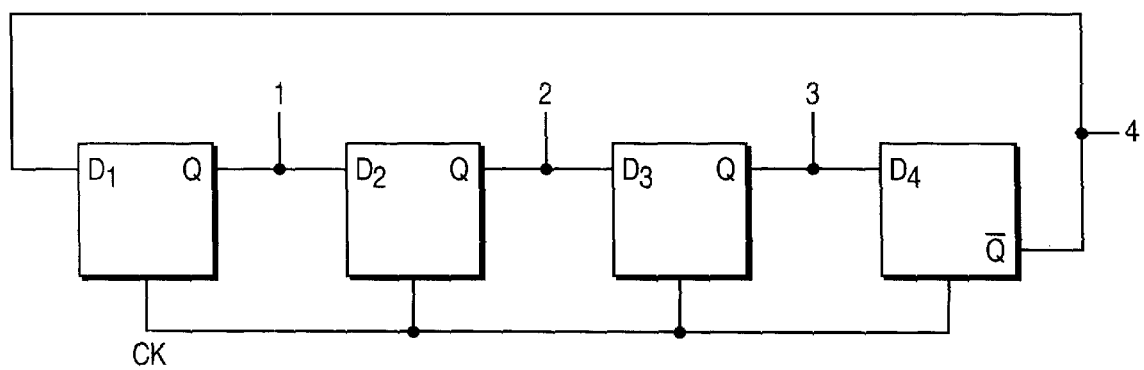
FIG. 7B illustrates one embodiment of a divide-by-four circuit.

The divide-by-four 705 creates broadband near exact quadrature signals for input into an I/Q mixer by using a digital divide-by-four circuit like circuit shown in FIG. 7B. Referring to FIG. 7B, the latches are common D flip-flops which are known in the art. The outputs at 1 and 3 are 90° out of phase as well as the outputs at 2 and 4. Any flip-flop device may be used meaning the circuit is not limited to D type latches. This generation of accurate 90 degree phase shifted signals is an advantage of the present invention over a single conversion approach. Also, the divide-by-four approach moves the image frequency to 3/5 at the RF frequency facilitating RF image rejection.

The outputs of mixers 207 and 208 comprise the I and Q signals respectively.

Overview of the Paging System of the Present Invention

The present invention may be implemented for use with pagers in a one-way or two-way paging system. In other words, the communication device of the present invention may be designed for use in a one-way paging system or in a two-way paging system. In a one-way paging system, a computer, server, or other control device is interfaced to a transmitter in the paging system and initiates transmission of paging messages. The transmitter, via links to a satellite and one or more base transceivers, sends these paging messages to pagers.

Figure 8:
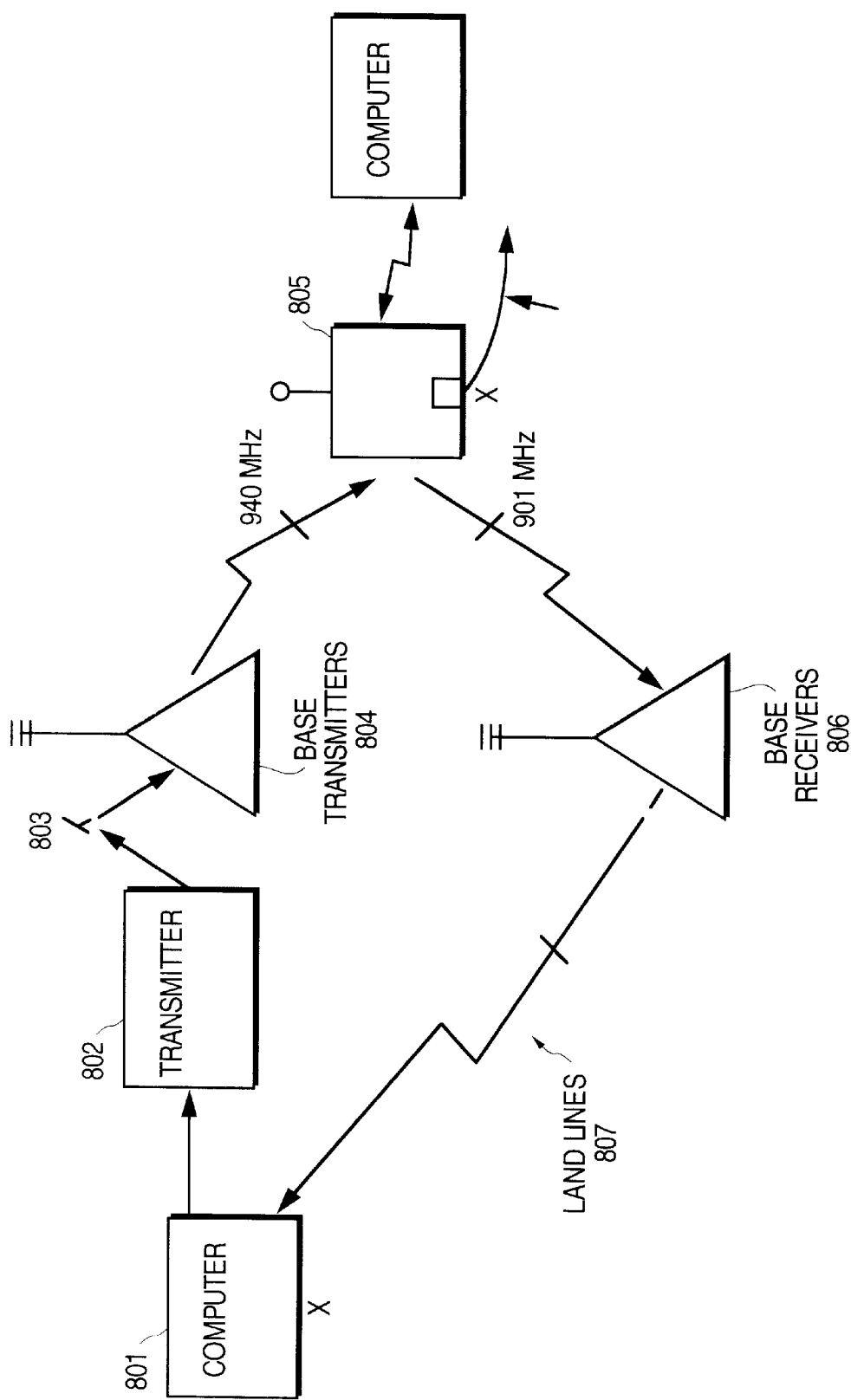
FIG. 8 is an exemplary paging system that may employ the communications device of the present invention.

In a two-way paging system, such as is shown in FIG. 8, these same components comprise the same communication path to the pager. Referring to FIG. 8, a computer or other control device 801 interfaces with a paging transmitter 802 (via, for instance, the Internet or some other network), transmitter 802 sends paging messages using satellite 803, and in turn, satellite 803 transmits the paging messages to base transmitter 804 for forwarding onto pager 805. In one embodiment, the communication between base transmitter 804 and pager 805 occurs at 940 MHz. Pager 805 includes transmitter functionality that allows for transmitting messages over air waves at 901 MHz to base receiver 806. Such functionality is well-known in the art. Base receiver 806 uses land lines to transmit the messages to the control device 801.

Whereas many alterations and modifications of the present invention will no doubt become apparent to a person of ordinary skill in the art after having read the foregoing description, it is to be understood that the particular embodiment shown and described by way of illustration is in no way intended to be considered limiting. Therefore, references to details of the various embodiment are not intended to limit the scope of the claims which in themselves recite only those features regarded as essential to the invention.

Thus, a multi-level mixer has been described.

We claim:

1. A receiver comprising:
   a first I/Q downconverter to generate a first set of I and Q channels at a first IF;
   a second I/Q downconverter coupled to the first I/Q downconverter to generate a second set of I and Q channels at a second IF in response to the I channel of the first set of I and Q channels and to generate a third set of I and Q channels at a second IF in response to the Q channel of the first set of I and Q channels; and
   an image rejection stage coupled to outputs of the second I/O downconverter to cancel an image frequency due to a downconversion performed by the first I/Q downconverter.

2. The receiver defined in claim 1 wherein the second IF comprises 0 KHz.

3. The receiver defined in claim 1 wherein the first IF comprises 0 KHz.

4. The receiver defined in claim 1 wherein the first IF comprises 5 KHz and the second IF comprises 0 KHz.

5. The receiver defined in claim 1 wherein the second I/Q downconverter comprises a plurality of mixers.

6. The receiver defined in claim 5 wherein the plurality of mixers comprises a first set of mixers to receive a first local oscillator signal at a first frequency and a second set of mixers to receive a second local oscillator signal at a second frequency.

7. The receiver defined in claim 6 wherein the first frequency comprises 5 KHz and the second frequency comprises 15 KHz.

8. The receiver defined in claim 6 wherein outputs of the plurality of mixers comprise 8 downconversions for four subchannels.

9. The receiver defined in claim 6 wherein the first and second local oscillator signals are derived from one clock signal.

10. The receiver defined in claim 1 wherein the image rejection stage comprises:
    an adder having a first pair of inputs and a first output, wherein the first pair of inputs are coupled to a first I signal of a first pair of I/Q outputs of the second I/Q downconverter and a first Q signal of a second pair of I/Q outputs of the second I/Q downconverter, the first output being a result of addition of the first I signal and first Q signal; and
    a subtractor having a second pair of inputs and a second output wherein the second pair of inputs are coupled to a second I signal of the second pair of I/Q outputs from the second I/Q downconverter and a second Q signal of the first pair of I/Q outputs of the second I/Q downconverter, the second output being the result of subtracting the second Q signal from the second I signal.

11. The receiver defined in claim 1 further comprising a set of low pass filters configured to filter the outputs of the image rejection stage.

12. The receiver defined in claim 11 further comprising a demodulator coupled to outputs of the set of low pass filters.

13. The receiver defined in claim 1 further comprising an RF downconversion having a local oscillator operable to generate a local oscillator signal; and
a mixer to downconvert an input signal using the local oscillator signal to generate the first set of I and Q channels at an RF.

14. The receiver defined in claim 13 further comprising a divide-by-N circuit coupled to the local oscillator and the first I/Q downconversion and configured to generate the first IF in response to the local oscillator signal.

15. The receiver defined in claim 1 further comprising further comprising a set of bandpass filters coupled between the first and second I/Q downconversions.

16. An apparatus for demodulating a multi-carrier QFSK signal that includes an I signal and a Q signal, both said I and Q signals having signals of first and second frequency included therein, said apparatus comprising a multi-level mixer for separating the signals of the first and second frequencies into multiple subchannels simultaneously using parallel levels of mixing and demodulation, wherein the parallel levels of mixing generate multiple pairs of I/Q signals, each pair representing an independent subchannel, and wherein the multi-level mixer comprises
a first I/Q downconverter to generate a first set of I and Q channels at a first IF; and
a second I/Q downconverter coupled to the first I/Q downconversion to generate a second set of I and Q channels at a second IF in response to the I channel of the first set of I and Q channels and to generate a third set of I and Q channels at a second IF in response to the Q channel of the first set of I and Q channels; and
an image rejection stage coupled to outputs of the second I/O downconverter to cancel an image frequency due to a downconversion performed by the first I/O downconverter.

17. The apparatus defined in claim 16 wherein the first and second IF comprises 0 KHz.

18. The apparatus defined in claim 16 wherein the first and second downconverter comprises a first set of mixers to receive a first local oscillator signal at a first frequency and a second set of mixers to receive a second local oscillator signal at a second frequency.

19. The apparatus defined in claim 18 wherein the first frequency comprises 5 KHz and the second frequency comprises 15 KHz.

20. The receiver defined in claim 16 wherein the image rejection stage comprises:
    an adder having a first pair of inputs and first outputs, wherein the first pair of inputs are coupled to a first I signal from a first pair of I/Q outputs of the second I/Q downconverter and a first Q signal from a second pair of I/Q outputs of the second I/Q downconverters; the first output being the result of addition of the first I signal and first Q signal; and
    a subtractor having a second pair of inputs and a second output, wherein the second pair of inputs are coupled to a second I signal from the second pair of I/Q outputs from the second I/Q downconverters and a second Q signal from the first pair of I/Q outputs of the second I/Q downconverter, the second output being the result of subtracting second Q signal from the second I signal.

* * * * *